(12) United States Patent
de Haas et al.

(10) Patent No.: US 11,061,844 B2
(45) Date of Patent: Jul. 13, 2021

(54) TRANSMITTER WITH INDEPENDENTLY ADJUSTABLE VOLTAGE AND IMPEDANCE

(71) Applicant: NXP B.V., Eindhoven (NL)

(72) Inventors: Clemens Gerhardus Johannes de Haas, Ewijk (NL); Johannes Petrus Antonius Frambach, Nijmegen (NL); Thomas John William Donaldson, Nijmegen (NL)

(73) Assignee: NXP B.V., Eindhoven (NL)

( * ) Notice: Subject to any disclaimer, the term of this patent is extended or adjusted under 35 U.S.C. 154(b) by 63 days.

(21) Appl. No.: 15/905,061

(22) Filed: Feb. 26, 2018

(65) Prior Publication Data

US 2018/0260353 A1 Sep. 13, 2018

(30) Foreign Application Priority Data

Mar. 7, 2017 (EP) .................................... 17159590

(51) Int. Cl.
*G06F 13/40* (2006.01)
*H04L 25/02* (2006.01)
(Continued)

(52) U.S. Cl.
CPC .... *G06F 13/4027* (2013.01); *H04L 12/40032* (2013.01); *H04L 25/0274* (2013.01);
(Continued)

(58) Field of Classification Search
None
See application file for complete search history.

(56) References Cited

U.S. PATENT DOCUMENTS 5,606,275 A * 2/1997 Farhang ............. H03K 19/0005
327/108
6,204,692 B1 * 3/2001 Nakagawa .......... H04L 25/0278
326/83
(Continued)

FOREIGN PATENT DOCUMENTS

DE 10 2010 043484 A1 5/2012
EP 2 660 974 A2 6/2013
(Continued)

OTHER PUBLICATIONS

'Digitally Adjustable Resistors in CMOS for High-Performance Applications' by Gabara and Knauer, IEEE Journal of Solid-State Circuits, vol. 21, No. 8, Aug. 1992. (Year: 1992).*

*Primary Examiner* — Steven G Snyder
(74) *Attorney, Agent, or Firm* — Rajeev Madnawat

(57) ABSTRACT

The present application relates to a circuit and a transceiver comprising the circuit. The circuit comprises two bus line terminals for coupling to a bus and a bridge circuit comprising two legs. Each leg comprises an adjustable pull resistance and an adjustable push resistance connected in series with a respective one of the two bus line terminals. The adjustable pull resistances and the adjustable push resistances of the bridge circuit enable to independently adjust a driver impedance and to independently adjust a differential driver voltage on the bus. The circuit may further comprise an edge detector is coupled to a transmit data input and configured to detect a transition on the transmit data input and to adjust the impedances of the adjustable pull resistances and the adjustable push resistances in response to the detected transition.

21 Claims, 7 Drawing Sheets

(51) Int. Cl.
*H04L 12/40* (2006.01)
*H03K 19/00* (2006.01)

(52) U.S. Cl.
CPC ...... *H04L 25/0278* (2013.01); *H03K 19/0005* (2013.01); *H04L 2012/40215* (2013.01); *H04L 2012/40273* (2013.01)

(56) References Cited

U.S. PATENT DOCUMENTS

| | | | |
|---|---|---|---|
| 6,771,097 B1 * | 8/2004 | Poh Ho | H03K 19/0005 326/30 |
| 7,221,196 B2 * | 5/2007 | Shirani | H04L 25/028 327/112 |
| 7,532,048 B1 | 5/2009 | Shirani et al. | |
| 8,169,203 B1 * | 5/2012 | Vemula | G05F 1/575 323/273 |
| 8,290,066 B2 * | 10/2012 | Mori | H04L 25/0278 375/257 |
| 8,593,202 B2 | 11/2013 | Mori et al. | |
| 8,633,733 B2 * | 1/2014 | Dettloff | H04L 25/0272 326/26 |
| 9,178,764 B2 | 11/2015 | Hartwich et al. | |
| 9,413,566 B2 * | 8/2016 | Mori | H04L 25/0292 |
| 9,614,505 B1 * | 4/2017 | Cho | H03K 17/08142 |
| 10,020,841 B2 | 7/2018 | De Haas et al. | |
| 10,044,377 B1 * | 8/2018 | Chong | H04L 27/04 |
| 10,209,723 B2 * | 2/2019 | Huang | G05F 1/56 |
| 10,313,152 B2 * | 6/2019 | Kishigami | H04B 3/548 |
| 10,355,876 B2 * | 7/2019 | Kishigami | H04L 12/40 |
| 10,615,996 B2 * | 4/2020 | de Haas | H04L 25/06 |
| 10,791,002 B2 * | 9/2020 | de Haas | H04L 12/40045 |
| 2004/0246026 A1 * | 12/2004 | Wang | H03K 19/018585 326/86 |
| 2009/0279617 A1 * | 11/2009 | Mori | H04B 3/04 375/257 |
| 2011/0199131 A1 * | 8/2011 | Boezen | H04L 25/028 327/109 |
| 2014/0035549 A1 * | 2/2014 | Hafizi | G05F 3/08 323/311 |
| 2014/0156893 A1 * | 6/2014 | Monroe | G06F 13/372 710/117 |
| 2016/0036604 A1 * | 2/2016 | Mori | H04L 25/0292 375/296 |
| 2017/0262394 A1 * | 9/2017 | De Haas | G06F 13/4282 |
| 2018/0041358 A1 * | 2/2018 | Kishigami | H04B 1/40 |
| 2018/0041361 A1 * | 2/2018 | Kishigami | H04B 3/548 |
| 2019/0058614 A1 * | 2/2019 | de Haas | H04L 12/40045 |
| 2019/0288870 A1 * | 9/2019 | de Haas | H04L 12/40032 |
| 2019/0334720 A1 * | 10/2019 | Zeh | H04L 63/126 |
| 2020/0252066 A1 * | 8/2020 | de Haas | H04B 1/38 |

FOREIGN PATENT DOCUMENTS

| | | |
|---|---|---|
| JP | 5498527 B2 | 5/2014 |
| JP | 5543402 B2 | 7/2014 |
| WO | 2010111619 A2 | 9/2010 |
| WO | 2015011515 A1 | 1/2015 |

* cited by examiner

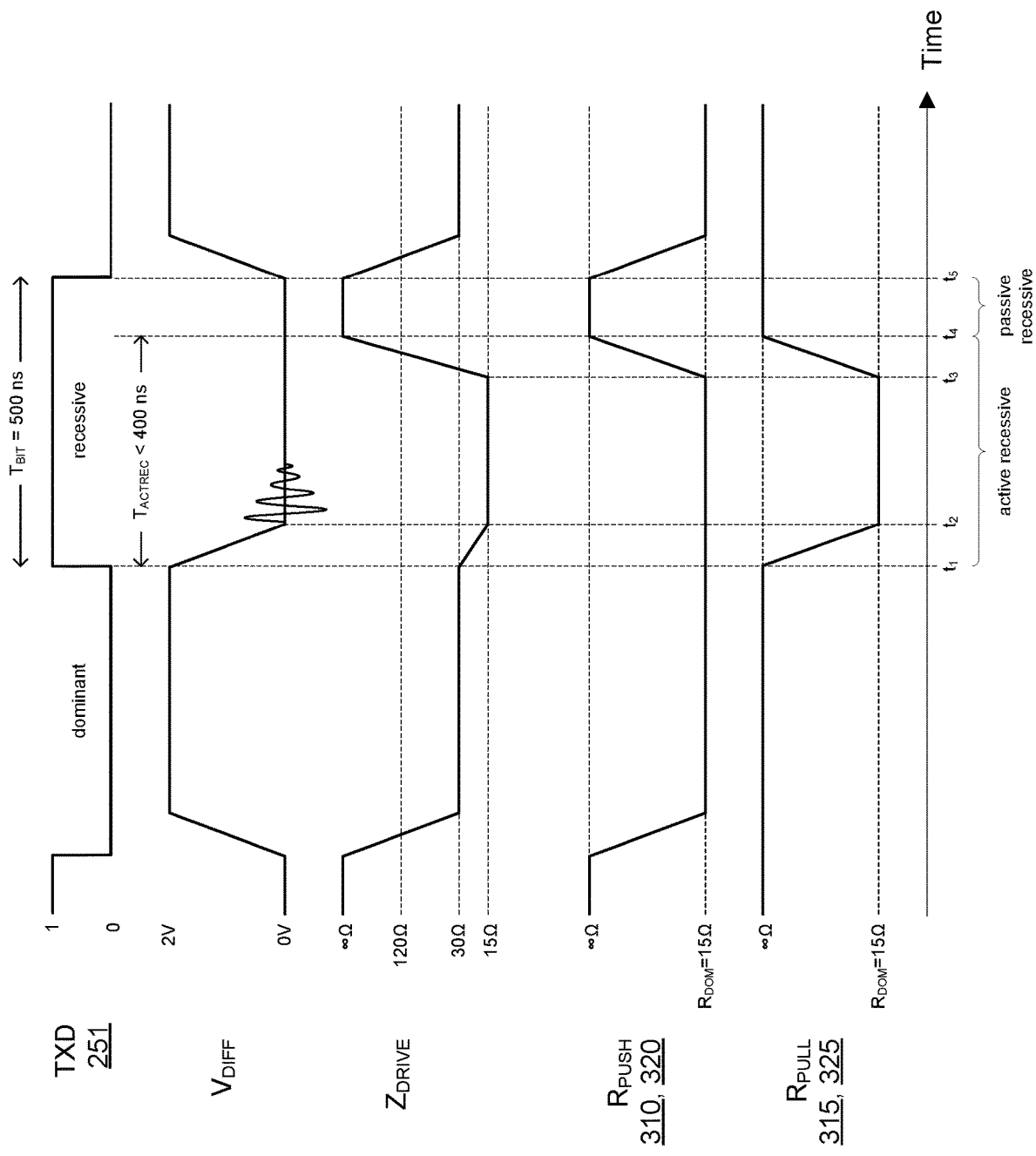

TRANSMITTER WITH INDEPENDENTLY ADJUSTABLE VOLTAGE AND IMPEDANCE

CROSS-REFERENCE TO RELATED APPLICATIONS

This application claims the priority under 35 U.S.C. § 119 of European Patent application no. 17159590.3, filed on Mar. 7, 2017, the contents of which are incorporated by reference herein.

FIELD OF THE INVENTION

The present application relates to bus operation and in particular to a bus signal transmitter with independently controllable voltage and impedance.

BACKGROUND

A Controller Area Network (CAN) bus is a multi-master serial bus that connects one or more nodes in a network. The CAN bus is typically used in automotive and industrial automation applications, however may be applied to other applications. Use of the CAN bus is governed by various ISO standards, for example ISO11898-1 for the CAN protocol, ISO 11898-2 for high speed CAN Physical Layer and ISO 11898-3 for low speed or fault tolerant CAN Physical Layer.

Current CAN buses may able to support varying data rates, in some cases the range may be between 1 MBit/s and 10 MBit/s. However, the support of such data rates is dependent on the network being correctly terminated. In current networks, this termination may comprise, for example a 120Ω termination resistance at the end nodes of the network and intermediate nodes being connected to the bus via stubs of a sufficiently short length. The termination is there to prevent reflections on the bus that may distort or compromise the integrity of the signaling on the bus.

The topology of the CAN bus network may comprise multiple nodes located at varying distances to the terminating impedances at the end nodes. The nodes furthest from the terminating resistors may cause reflection when one of the nodes transmit which may cause ringing on the bus. This may reduce the maximum data rate at which the bus may operate correctly.

Traditionally other factors, such as the length of the bus cable, limited the data rate to a speed below the speed at which ringing would become an issue. However, advancement in the CAN bus protocol, for example CAN bus flexible data rate (CAN FD), have increased the possible data rate to a point at which ringing becomes influential.

It thus becomes of interest to address the termination resistance and/or the presence of ringing or reflections on the bus.

SUMMARY

The present invention provides a circuit and a transceiver comprising the circuit as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

FIG. 7 schematically illustrates a signaling diagram showing an example operation of a bus transceiver circuit according to another example of the present invention;

FIG. 8b schematically illustrated an idealized differential waveform in accordance with the example of FIG. 8a;

DETAILED DESCRIPTION

Figure 1:
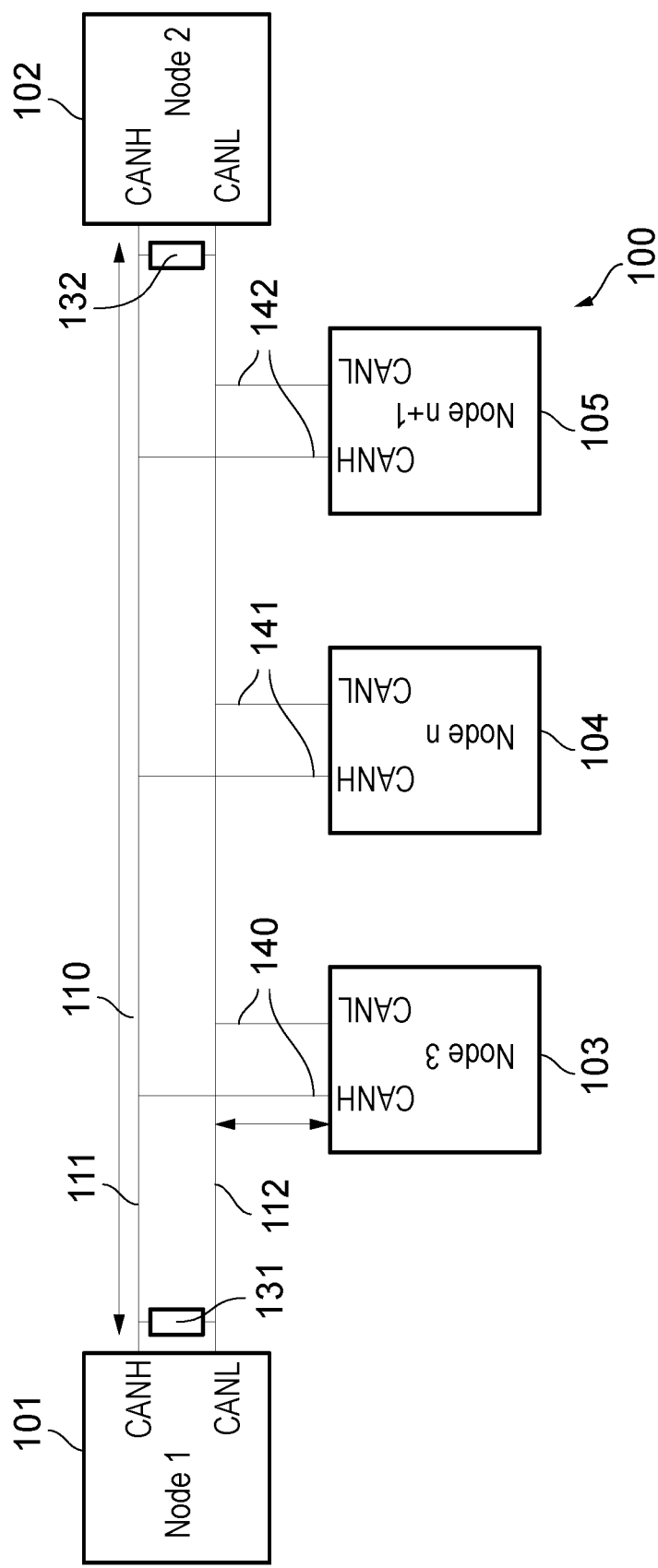
FIG. 1 schematically illustrates a block diagram of an example of a CAN bus network with multiple nodes according to an example of the present invention.

Embodiments of the present disclosure will be described below in detail with reference to drawings. Note that the same reference numerals are used to represent identical or equivalent elements in figures, and the description thereof will not be repeated. The embodiments set forth below represent the necessary information to enable those skilled in the art to practice the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

FIG. 1 shows an illustrative example of a network 100 comprising a plurality of nodes coupled together via a CAN bus according to an example of the present application.

The network 100 comprises a plurality of nodes exemplified by a first node 101, a second node 102, a third node 103, an $(n-1)^{th}$ node 104 and an $n^{th}$ node 105. The nodes 101 to 105 are coupled together for communication by a bus 110. Herein the bus is exemplified as a CAN bus 110, implemented in form of a two-wire bus comprising a CANH wire 111 and a CANL wire 112. In this case, the wires 111 and 112 form a single twisted-pair cable having a nominal cable impedance. Each of the nodes 101 to 105 is coupled to the CANH 111 and CANL 112 wires via tap lines.

In this example the nominal cable impedance is 120Ω, which is typical of some automotive applications of the CAN bus. It will however be appreciated that embodiments are applicable to other line impedances and the present application should not be understood to be limited to a specific nominal cable impedance. It will also be appreciated that the exact impedance of the line may be affect by physical factors such as the cable and/or isolation material. While line impedance is assumed to be 120Ω, the actual line impedance may vary around this value and can be considered to be approximately 120Ω. Similarly, termination resistors may vary as to their exact value due to real-world implementation.

The first node 101 is a first end node of the bus 110 and has a termination resistance $R_{Term}$ 131 corresponding to the nominal cable impedance such as 120Ω. It will be appreciated that 120Ω is in accordance with this example of cable impedance. The second node 102 is a second end node and has a termination resistance $R_{Term}$ 132 corresponding to the nominal cable impedance such as 120Ω. The third, $(n-1)^{th}$ node and $n^{th}$ node are intermediate nodes and are coupled to the CAN bus 110 via stubs or tap lines 140, 141 and 142. Such intermediate nodes may be unterminated or optionally applied with a high ohmic termination in the kilo-Ohms range in some systems. In some examples, high ohmic termination may provide limited ringing suppression at these quasi open ends of the cable, but the effectiveness is very limited due to the deviation from the nominal cable impedance.

Each of the nodes may be coupled to further circuitry, such as sensors or microcontrollers, that may be configured to communicate with one or more of the other nodes using the CAN bus 110.

Figure 2:
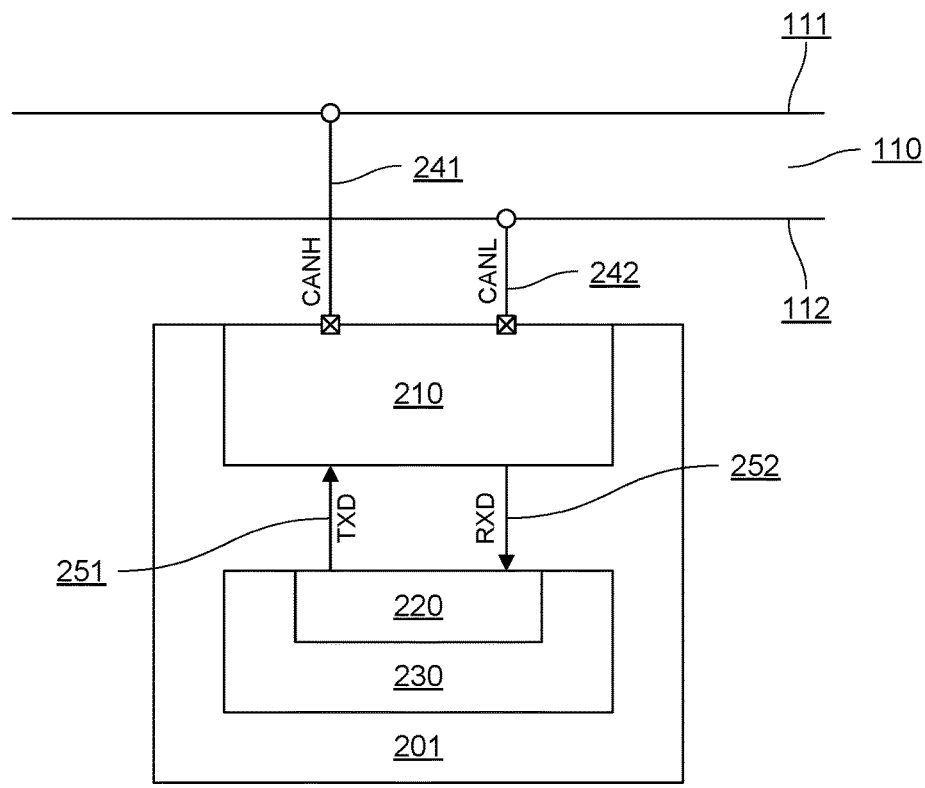
FIG. 2 schematically illustrates a block diagram of a network node according to an example of the present invention.

FIG. 2 illustrates a block diagram of an example of a node 201, for example one of the nodes 101 to 105 in more detail.

Node 201 is coupled to the CAN bus 110 with a stub line 241 coupled to the CANH wire 111 and a stub line 242 coupled to the CANL wire 112. The stub lines 241, 242 are coupled to a CAN bus transceiver 210 of the node 201. It will be appreciated, that in the case where stubs are not needed, for example for an end node, the CAN bus transceiver will be coupled directed to the wires 111 and 112.

The CAN bus transceiver 210 is coupled to a CAN controller 220 via a transmit data connection (TXD) 251 and a receive data connection (RXD) 252.

The CAN controller 220 may form part of a microcontroller 230 of the node 201.

The microcontroller 230 may determine messages that are to be transmitted on the bus and provide these to the CAN controller 220. The microprocessor may receive messages from the bus from the CAN controller 220 and interpret them. The microcontroller 230 may be further connected to other entities, such as sensors or actuators and provide an interface between them and the CAN bus 110.

The CAN controller 220 may receive bits from the CAN bus 110 (via the bus transceiver 210) and reconstruct the bits into a message to be interpreted by the microcontroller 230. The CAN controller may receive a message from the microcontroller 230 and provide it as serial bits to the bus via the CAN transceiver 210.

The CAN transceiver 210 may convert the digital data bits on the TXD pin 251 from the CAN controller 220 into analogue bus signals. The CAN transceiver 210 may further convert the analogue bus signals into digital bits to be provided via the RXD pin 252 to the CAN controller 220.

The implementation of the network 100 may be governed by certain parameters in order to reduce ringing and protect the integrity of the signaled data at higher data rates. For example, the CAN bus 110 may have a maximum length at which maximum data rates may be achieved. In another example, the stubs 140, 141 and 142 connecting the intermediate nodes 101 to 105 to the CAN bus 110 may be kept as short as possible to reduce reflections. In one case, the maximum length of the CAN bus may be restricted to 40 m and the stubs to less than 0.3 m, however it will be appreciated that this is by way of example.

Despite this requirement, the length of the bus and the stubs may be subject to other factors. For example, in an automotive application for example, the implementation of the CAN bus network may be governed by the shape and size of a vehicle and position of the nodes. It may not always be possible to have stubs that are as short as desired. Furthermore, even in the case of the stubs being as short as is practical, ringing may still occur at higher data rates.

The ringing in the unterminated stub lines may corrupt the communication on the bus. This becomes more of a problem with new protocols, for example CAN FD, where the data rate is higher. One way to address ringing is to redesign network topology in order to improve termination, however this is time consuming and costly.

Embodiment of the present application provide a method of suppressing ringing that may be implemented on existing network topologies. Furthermore, embodiments may take into account the speed at which this suppression is implemented and mitigate the potential of glitches occurring in ringing suppression circuits.

Basically, the maximum bus length is determined by, or rather is a trade-off with the selected signaling rate. A signaling rate decreases as transmission distance increases. While steady-state losses may become a factor at the longest transmission distances, the major factors limiting signaling rate as distance is increased are time varying. Cable bandwidth limitations, which degrade the signal transition time and introduce inter-symbol interference (ISI), are primary factors reducing the achievable signaling rate when transmission distance is increased. For a CAN bus, the signaling rate is also determined from the total system delay—down and back between the two most distant nodes of a system and the sum of the delays into and out of the nodes on a bus with the typical e.g. 5 ns/m propagation delay of a twisted-pair cable. Also, consideration must be given the signal amplitude loss due to impedance of the cable and the input impedance of the transceivers. Under strict analysis, skin effects, proximity to other circuitry, dielectric loss, and radiation loss effects all act to influence the primary line parameters and degrade the signal.

Since stub-lines are unterminated, signal reflections can develop in a stub that drive signal levels back and forth across a receivers input thresholds, creating errors. Bit-sampling occurs near the end of a bit, so it is mandatory that all signal reflections in a CAN stub-line be attenuated before or during the propagation delay segment to provide an adequate margin of safety. To minimized reflections, stub-line length should not exceed one-third (⅓) of the line's critical length. Beyond this stub-length, many variables come into play since the stub is no longer considered to be a lumped parameter. This is the maximum length that a stub remains invisible to a transmission line. The critical length of a bus line occurs at the point where the down-and-back propagation delay of a signal through a line equals the transition time of a signal (the greater of the rise or fall times). For instance, a typical CAN driver may have a 50 ns transition time, and when considering a typical twisted-pair transmission line propagation delay of 5 ns/m, the down-and-back delay for one meter becomes 10 ns/m. The critical length becomes 5 m (50 ns/10 ns/m=5 m), and the max un-terminated stub length for the network is ⅓ of the critical length, or 1% m (=1.67 m).

Those skilled in the art immediately understand that existing network topologies developed for a (lower) target data transmission rate over the network may not be maintained in case the transmission rate is increased unless further measures are taken to suppress signal disturbances and to improve the signal quality.

Figure 3:
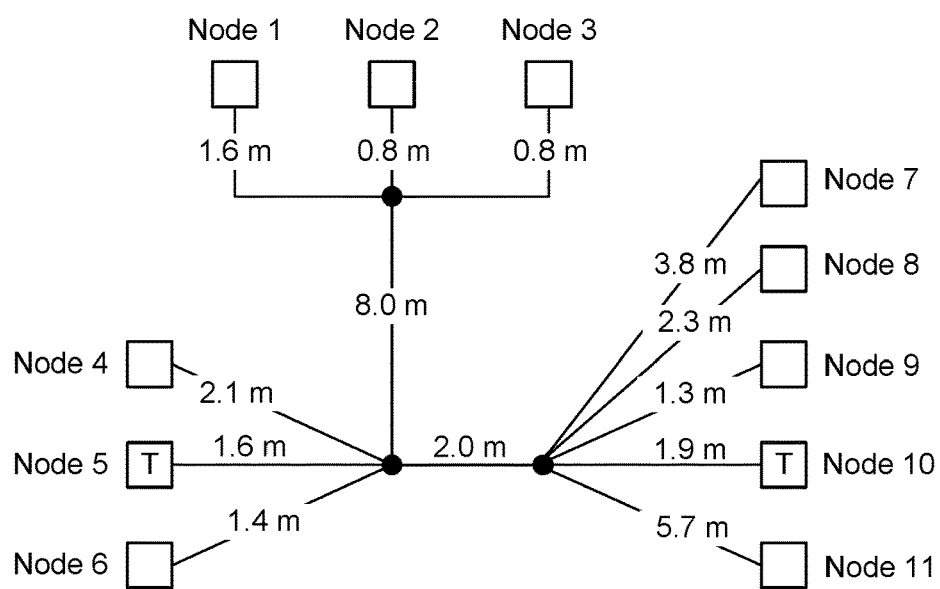
FIG. 3 schematically illustrates a block diagram of an example of a CAN bus network with multiple nodes according to another example of the present invention.

FIG. 3 illustrates a block diagram of an exemplary real case scenario of a network comprising a plurality of nodes coupled together via a CAN bus according to an example of the present application. The network comprises node 1 to node 11, illustrating in general multiple nodes, coupled together for communication via the CAN bus. Herein the CAN bus and stubs thereof are shown as solid lines indicative of the aforementioned single twisted-pair cable. The node 5 and the node 10 should be considered to form the respective end nodes of the CAN bus. Each of the node 5 and node 10 has a termination resistance $R_{Term}$ "T" according to the nominal cable impedance such as 120Ω.

When for instance one of the nodes 1, 2, 3, 4, 7, 8 or 11 that are further away from the termination resistors at the nodes 5 and 10 (exemplary stub lengths are indicated in FIG. 3) starts sending data, reflections in the network will cause signal disturbances. A CAN FD controller samples the bus for instance typically at 70% of bit time. If the duration of the signal disturbance is longer than the typical sampling time, an erroneous bit information may be captured, which results in a corrupted data message. By using longer bit time, this problem of signal disturbance may be avoided but effectively limiting the maximum data transmission rate of the network. Reflections due to too long stubs are a major transmission rate limiting factor when using network topologies develop for classical CAN protocol at a transmission rate of e.g. 500 kb/s also for the more recent CAN FD protocol, which specifies transmission rates form 1 MBit/s to 5 MBit/s or even higher.

Further, it should be considered that even with a well-terminated network, there may be a further major transmission rate limiting factor due to a high capacitance bus loading. In the case of a high number of node connected to the CANB bus network, the dominant to recessive transition becomes very slow. In recessive state the transmitter is high ohmic. When each connected node adds a capacitance of for instance a maximum of 100 pF to the CAN bus and the CAN bus impedance is fixed at 60Ω, the dominant to recessive transition will never be faster than approximately 100 ns in case of a network, to which ten nodes are connected. If the network is desired to have a transmission rate of 5 MBit/s or higher, the bit time is 200 ns or shorter.

Figure 4:
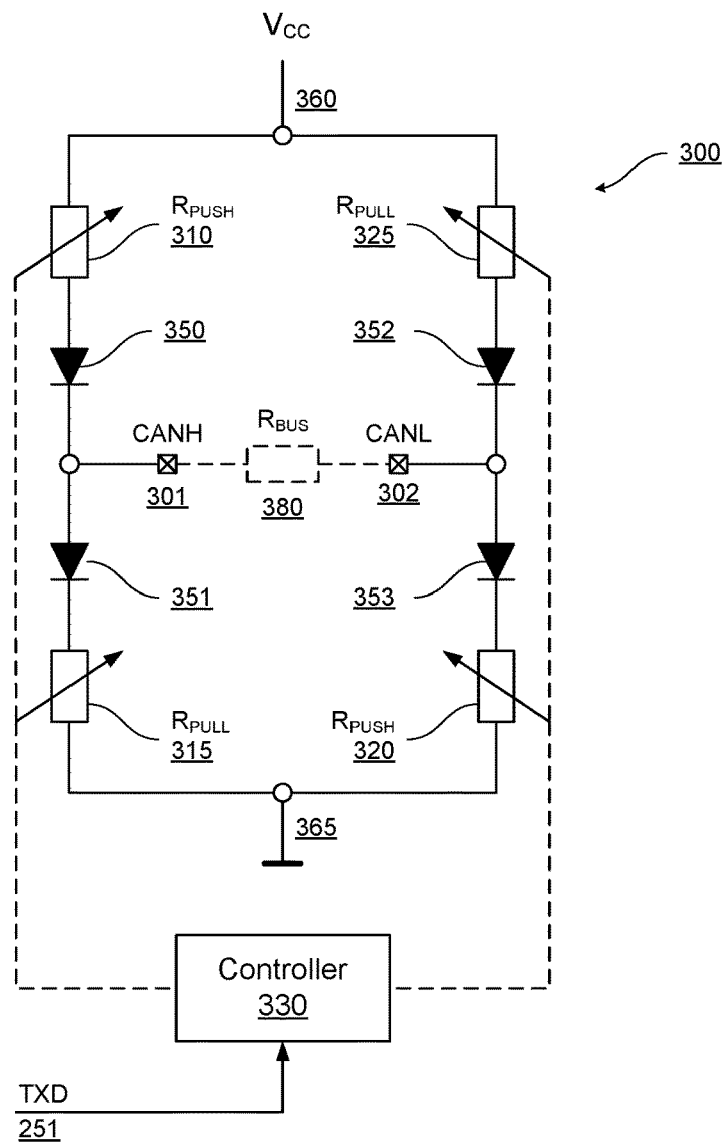
FIG. 4 schematically illustrates a block diagram of a bus transceiver circuit according to an example of the present invention.

Referring now to FIG. 4, a block diagram of a bus transceiver circuit according to an example of the present invention is schematically illustrated. The circuit 300 forms an impedance bridge coupling to CANH and CANL terminals 301, 302, which in turn are coupled to the CANH stub line 241 and the CANL stub line 242, respectively, and further to the CANH wire 111 and CANL wire 112 (cf. the embodiment shown in FIG. 2). The bridge comprises a first leg, which is also referred to as CANH (side) leg, and a second leg, which is also referred to as CANL (side) leg. Each leg comprises two controllable impedances, which impedance properties are dynamically adjustable for instance by an edge detector 330. The CANH leg comprises a push resistor $R_{PUSH}$ 310, which is connected between a common voltage supply rail $V_{CC}$ 360 and the CANH terminal 301, and a pull resistor $R_{PULL}$ 315, which is connected between the CANH terminal 301 and a common ground rail 365. The CANL leg comprises a pull resistor $R_{PULL}$ 325, which is connected between the common voltage supply rail $V_{CC}$ 360 and the CANL terminal 302, and a push resistor $R_{PUSH}$ 320, which is connected between the CANL terminal 302 and the common ground rail 365. The legs may be understood to have a symmetrical resistor configuration with respect to the CANH and CANL terminals 301 and 302.

The CAN bus has a load impedance represented by the equivalent bus impedance $R_{BUS}$ 380. Typically, the bus impedance $R_{BUS}$ 380 has an impedance of approximately 60Ω in accordance with the above described typical nominal cable impedance of 120Ω provided that the CAN bus is terminated with termination resistance $R_{Term}$=120Ω at each end.

Further, diodes 350 to 353 may be connected in series with each of the resistors 310 to 325 in order to prevent reverse currents flowing from the CAN bus into the common voltage supply rail 360 and the common ground rail 365 in case of a bus voltage higher than a supply voltage potential $V_{CC}$ on the common voltage supply rail 360 or lower than a ground potential on the common ground rail 365.

Figure 5:
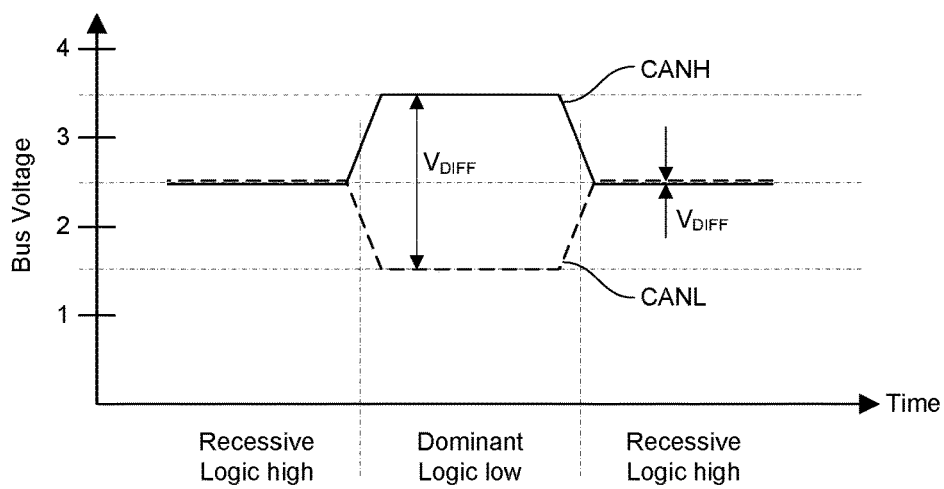
FIG. 5 schematically illustrated an idealized differential waveform.

An idealized differential waveform is schematically illustrated in FIG. 5. The waveform is representative of for instance an idealized CAN bus signal resulting from a transmitting transceiver operating with a power supply rail of $V_{CC}$ equal to 5 volts and ground. An active transceiver drives the waveform to a "dominant" state representing a logic low level (logic zero). Bus transceivers are biased at approximately $V_{CC}/2$ such that the differential waveform peaks CANH 111 and CANL 112 avoid distortion by not approaching the supply voltage rails. A CAN bus logic high "recessive" level results when transceiver drivers are inactivated and remove their respective differential output voltages from the bus.

The impedance properties of the two push resistors $R_{PUSH}$ 310 and 320 and the two pull resistors $R_{PULL}$ 315 and 325 are dynamically adjustable for instance by the edge detector 330, an input of which is coupled to the transmit data connection (TXD) 251. The edge detector 300 is configured to apply common control characteristics for the two push resistors $R_{PUSH}$ 310 and 320 and the edge detector 300 is further configured to apply common characteristics for the two pull resistors $R_{PULL}$ 315 and 325. The same control characteristics should be understood herein in that the respective two resistors have the same impedance property being a function of a set of parameters.

The impedance values of the push resistors $R_{PUSH}$ 310 and 320 and the pull resistors $R_{PULL}$ 315 and 325 are dynamically adjustable based on two parameters x and y. The domain of the parameter x may comprise the value range x=(0, 1), where x=(0, 1)={x∈$\mathcal{R}$, 0<X<1}, and the domain of the parameter y may comprise the value range y=(0, 2], where y=(0, 2]={y∈R, 0<y≤2}. The parameters x and y are independent of each other. The push impedance value $R_{PUSH}$ of the push resistors $R_{PUSH}$ 310 and 320 are adjustable as following:

$$R_{PUSH} = \frac{R_{DOM}}{x \cdot y}$$

The pull impedance value $R_{PULL}$ of the pull resistors $R_{PULL}$ 315 and 325 are adjustable as following:

$$R_{PULL} = \frac{R_{DOM}}{(1-y) \cdot y}$$

The driver impedance $Z_{DRIVE}$ of the transmitter circuit 300 results in $$Z_{DRIVE} = 2 \cdot \frac{1}{\frac{1}{R_{PUSH}} + \frac{1}{R_{PULL}}}$$

$$= 2 \cdot \frac{1}{\frac{x \cdot y}{R_{DOM}} + \frac{(1-x) \cdot y}{R_{DOM}}}$$

$$= 2 \cdot \frac{1}{\frac{y}{R_{DOM}}}$$

$$= 2 \cdot \frac{R_{DOM}}{y}$$

which is a function on the parameter y.

This means that the driver impedance $Z_{DRIVE}$ of the transmitter circuit 300 can be dynamically adjusted to any impedance value between low ohmic state, which is herein determined by a lowest driver impedance value $Z_{DRIVE} = R_{DOM}$, and high ohmic state, which is herein represented by $Z_{DRIVE} = \infty$. $R_{DOM}$ is the minimum drive impedance value of the transmitter circuit 300. For instance, the minimum drive impedance value may be $R_{DOM} = 15\Omega$. It should be noted that high ohmic state, referred herein by $Z_{DRIVE} = \infty$, may comprise a maximum drive impedance value in the range of kilo Ohms or mega Ohms.

The differential driver voltage $V_{DIFF}$, which is the potential difference between the voltages driven on CANH wire 111 and the CANL wire 112 ($V_{CANH} - V_{CANL}$) is also dynamically adjustable:

$$V_{DIFF} = \frac{R_{BUS}}{R_{BUS} + \frac{2 \cdot R_{DOM}}{y}} \cdot (2x - 1) \cdot (V_{CC} - 2 \cdot \Delta V_{Diode})$$

$$= \frac{R_{BUS}}{R_{BUS} + Z_{DRIVE}} \cdot (2x - 1) \cdot (V_{CC} - 2 \cdot \Delta V_{Diode})$$

which is a function of the parameter x and the driver impedance value $Z_{DRIVE}$, wherein $\Delta V_{Diode}$ is the voltage drop of the diodes 350-353 connected in series to the push resistors $R_{PUSH}$ 310, 320 and pull resistors $R_{PULL}$ 315, 325, respectively, $V_{CC}$ is the supply voltage potential provided at the common voltage supply rail 360 (with respect to the voltage potential of the ground rail 365), and $R_{BUS}$ is the equivalent bus impedance, e.g. $R_{BUS} = 60\Omega$. At a given driver impedance value $Z_{DRIVE}$, the differential driver voltage $V_{DIFF}$ can be adjusted between $V_{min}$ $$V_{min} = V_{DIFF}(x=0) = -\frac{R_{BUS}}{R_{BUS} + Z_{DRIVE}} \cdot (V_{CC} - 2 \cdot \Delta V_{Diode}) = -V_{limit}$$

and $V_{max}$ $$V_{max} = V_{DIFF}(x=1) = \frac{R_{BUS}}{R_{BUS} + Z_{DRIVE}} \cdot (V_{CC} - 2 \cdot \Delta V_{Diode}) = V_{limit}$$

It should be noted that the minimum differential driver voltage $V_{min}$ and the maximum differential driver voltage $V_{max}$ are functions of the driver impedance value $Z_{DRIVE}$, i.e. $V_{min} = V_{min}(Z_{DRIVE})$ and $V_{max} = V_{max}(Z_{DRIVE})$. For instance, assume that the driver impedance $Z_{DRIVE}$ (e.g. $Z_{DRIVE} = 120\Omega$) substantially corresponds to the termination resistance $R_{Term}$ (e.g. $R_{Term} = 120\Omega$), which means that equivalent bus impedance $R_{BUS} = \frac{1}{2} Z_{DRIVE}$ (e.g. $R_{BUS} = 60\Omega$). Hence, the maximum differential driver voltage $V_{max}$ results in $$V_{max} = \frac{1}{3} \cdot (V_{CC} - 2 \cdot \Delta V_{Diode}).$$

Further, the voltage potential $V_{CC}$ may be $V_{CC} = 5$ V and the voltage drop $\Delta V_{Diode}$ of the diodes 350-353 may be $\Delta V_{Diode} = 1$ V (a typical voltage drop $\Delta V_{Diode}$ of a diode is in the range of 0.5 V to 1 V). The maximum differential driver voltage $V_{max}$ results in $V_{max} = 1$ V. In order to drive a differential driver voltage $V_{DIFF}$, the driver impedance $Z_{DRIVE}$ has to be adjusted to a lower impedance value.

More general, the differential driver voltage $V_{DIFF}$, which is the potential difference between the voltages driven on CANH wire 111 and the CANL wire 112 ($V_{CANH} - V_{CANL}$) is dynamically adjustable $$V_{DIFF} = \frac{R_{BUS}}{R_{BUS} + \frac{2 \cdot R_{DOM}}{y}} \cdot (2x - 1) \cdot V_{CC\_eff}$$

$$= \frac{R_{BUS}}{R_{BUS} + Z_{DRIVE}} \cdot (2x - 1) \cdot V_{CC\_eff}$$

where $V_{CC\_eff}$ relates to an effective supply voltage available to the voltage dividing push and pull resistors or each leg. In the example shown in FIG. 4, the effective supply voltage is determined by the voltage potential difference between the voltage supply rail 360 and the ground rail 365 and the voltage drop $\Delta V_{Diode}$ due to the diodes connected in series with the push resistors 310, 320 and pull resistors 315, 325:

$$V_{CC\_eff} = V_{CC} - 2 \cdot \Delta V_{Diode}$$

Those skilled in the art understand that the present application is not limited to the specific example shown in FIG. 4. The legs may comprise further components, which may have to be considered in the effective supply voltage $V_{CC\_eff}$.

When the bus is in a passive recessive state, the impedance on the bus is determined by the termination resistance in the network. The equivalent bus impedance is for instance $R_{BUS} = 60\Omega$ in correspondence to the termination resistance $R_{Term} = 120\Omega$. When the bus is in an active recessive state or a dominant state, the impedance of the bus is determined by the dynamically adjustable driver impedance value $Z_{DRIVE} = Z_{DRIVE}(y)$ of the transmitter circuit 300, which is a function of the parameter y.

Examples of transmitter in adjusted to different impedance states (wherein for the sake of explanation only it should be assumed that the lowest driver impedance value $R_{DOM} = 15\Omega$, the voltage drop of the diodes $\Delta V_{Diode} = 1$ V, $V_{CC} = 5$ V is supplied to the voltage supply rail, the termination resistance is $R_{Term} = 120\Omega$, and the equivalent bus impedance is $R_{BUS} = 60\Omega$):

CAN transmitter dominant with $V_{DIFF} = 2$ V:

$x = 1, y = 1 \Rightarrow R_{PUSH} = 15 \Omega (= R_{DOM}), R_{PULL} = \infty \Omega$ (high ohmic)

$\Rightarrow Z_{DRIVE} = 30 \Omega, V_{DIFF} = 2$ V

CAN transmitter (passive) recessive with $Z_{DRIVE}=\infty \Omega$ and $V_{DIFF}=0$ V:

$x = 1, y = 0 \quad \Rightarrow \quad R_{PUSH} = \infty \ \Omega(\text{high ohmic}), R_{PULL} = \infty \ \Omega \ (\text{high ohmic})$ $\Rightarrow \quad Z_{DRIVE} = \infty \ \Omega, V_{DIFF} = 0 \ V$ CAN transmitter active recessive with $Z_{DRIVE}=120 \ \Omega$ and $V_{DIFF}=0$ V:

$x = 0.5, y = 0.25 \quad \Rightarrow \quad \begin{array}{l} R_{PUSH} = 120 \ \Omega( = R_{Term}), \\ R_{PULL} = 120 \ \Omega \ ( = R_{Term}) \end{array}$ $\Rightarrow \quad Z_{DRIVE} = 120 \ \Omega, V_{DIFF} = 0 \ V$ CAN transmitter active recessive with $Z_{DRIVE}=150$ and $V_{DIFF}=0V$:

$x = 0.5, y = 2 \quad \Rightarrow \quad R_{PUSH} = 15 \ \Omega( = R_{DOM}), R_{PULL} = 15 \ \Omega \ ( = R_{DOM})$ $\Rightarrow \quad Z_{DRIVE} = 15 \ \Omega\Omega, V_{DIFF} = 0 \ V$ CAN transmitter negative active recessive with dominant in opposite phase, $V_{DIFF}=-2$ V:

$x = 0, y = 1 \quad \Rightarrow \quad R_{PUSH} = \infty \ \Omega(\text{high ohmic}), R_{PULL} = 15 \ \Omega \ ( = R_{DOM})$ $\Rightarrow \quad Z_{DRIVE} = 30 \ \Omega, V_{DIFF} = -2 \ V$ The above examples illustrate that the transmitter circuit 300 described in the present application allows for independently adjusting the differential driver voltage $V_{DIFF}$ and driver impedance $Z_{DRIVE}$ based on the parameters x and y, which define the impedance properties $R_{PUSH}$ of the push resistors 310 and 320 and the impedance properties $R_{PULL}$ of the pull resistors 315 and 325. The above examples illustrate a use of the transmitter circuit 300 for a static adjustment of a predefined differential driver voltage $V_{DIFF}$ with a predefined driver impedance $Z_{DRIVE}$ during a predefined bus state. However, the properties of the transmitter circuit 300 may be also dynamically adjusted for instance during a transition phase such as a dominant (DOM) to recessive state (REC) transition in order to improve the signal quality and in particular to suppress or prevent ringing.

Ringing can be prevented or suppressed in that an adequate or low impedance is used to drive the CAN bus during state transitions. For transitions from recessive state to dominant state the driver impedance of the transmitter is low ohmic (e.g. about ~30Ω) to be able to drive a dominant voltage on the CAN bus. For transitions from dominant state to recessive state the drive impedance of the transmitter is high ohmic in a classical CAN transmitter. The transmitter described by the present application enables to control the impedance during and after the dominant to recessive transition. Examples how this can be achieved are explained below.

Figure 6:
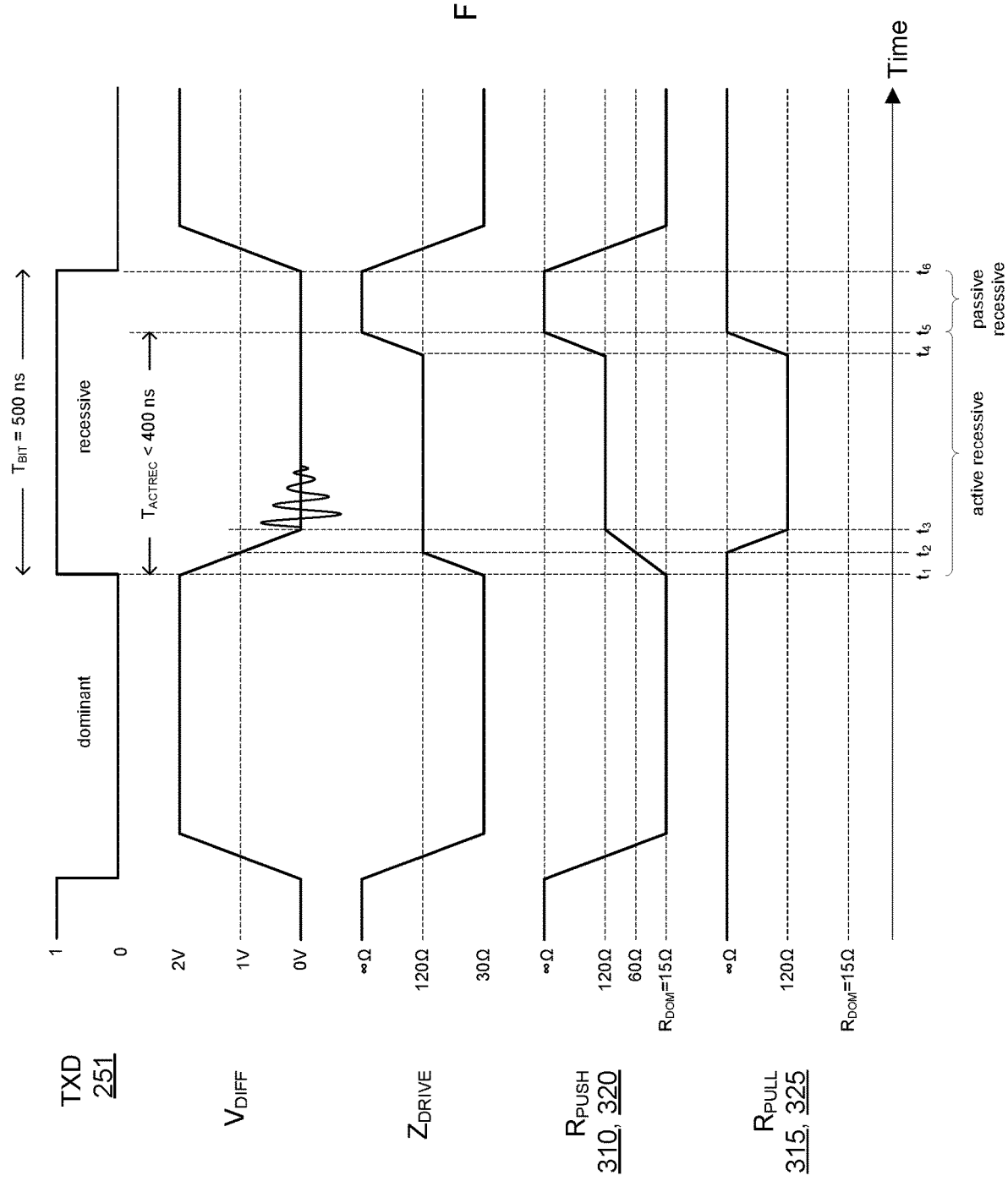
FIG. 6 schematically illustrates a signaling diagram showing an example operation of a bus transceiver circuit according to an example of the present invention.

Referring now to FIG. 6, a signaling diagram showing an example operation of a bus transceiver circuit according to an example of the present invention is schematically illustrated. In this example, the time taken to transmit a bit is bit time $T_{Bit}=500$ ns. It will be appreciated that the time $T_{Bit}$ taken to transmit a bit corresponds to the data rate of the CAN bus. In this case the bit time $t_{Bit}=500$ ns corresponding to a data bit rate of 2 MBits/s, however the data rate may change with the operation of the CAN bus. It will be appreciated that when the data rate changes, for example due to a change in operation mode, the bit time $T_{Bit}=500$ ns and all further related time periods will change accordingly. For the sake of explanation only it should further be assumed that the lowest driver impedance value $R_{DOM}=15\Omega$, the voltage drop of the diodes $\Delta V_{Diode}=1$ V, $V_{CC}=5$ V is supplied to the voltage supply rail, the termination resistance is $R_{Term}=120\Omega$, and the equivalent bus impedance is $R_{BUS}=60\Omega$.

In particular, FIG. 6 illustrates a signaling timing diagram, in which the transmitter drives the bus with 120Ω for 400 ns after the dominant to recessive transition. In this example the transmitter impedance of 120Ω is chosen, however the transmitter impedance of 120Ω should not be understood as limiting the present application. Similarly, for the duration of the active recessive period $T_{ACTREC}$, this is chosen to be 400 ns or less for the bit time $T_{Bit}=500$ ns, but the active recessive period $T_{ACTREC}$ may also be another value.

In operation, the CAN bus controller 220 provides a serial bit stream 400 to the CAN transceiver 210 for transmission on the bus. The edge detector 330 monitors edges on this bit stream. At time $t_1$, the signal on TXD 251 transitions from low to high, which will cause a dominant to recessive transition of the differential driver voltage $V_{DIFF}$ on the CAN bus 110. It will be appreciated that the low to high transition of TXD 251 will not immediately cause a change on the CAN bus because there is a delay as the signal 251 is received by the CAN transceiver 210 and converted to a bus level for the CAN bus 110.

In the dominant state, the push resistors 310 and 320 are controlled to stay at $R_{PUSH}=R_{DOM}=15\Omega$ and the pull resistors 315 and 325 are controlled to stay high ohmic, which results in a low ohmic driver impedance $Z_{DRIVE}=30\Omega$.

In response to the detection of the dominant to recessive transition at time $t_1$, the driver impedance $Z_{DRIVE}$ is adjusted from the starting driver impedance $Z_{DRIVE}=30\Omega$, representing the low ohmic driver impedance during $Z_{DRIVE}$ during dominant state, to a target driver impedance $Z_{DRIVE}=120\Omega$; the adjustment is preferably performed continuously over time and more preferably at a constant change rate. The driver impedance $Z_{DRIVE}$ is adjusted by controlling the push resistors 310 and 320 to increase their impedances from the starting push impedance $R_{PUSH}=15\Omega$ to the target push impedance $R_{PUSH}=120\Omega$, the adjustment is preferably performed continuously over time and more preferably at a constant change rate. The pull resistors 315 and 325 are controlled to stay high ohmic ($R_{PULL}=\infty\Omega$).

In response to the adjustment of the driver impedance $Z_{DRIVE}$, the differential driver voltage $V_{DIFF}$ on the CAN bus is adjusted from a dominant differential voltage (e.g. $V_{DIFF}\approx 2$ V) to a recessive differential voltage (e.g. $V_{DIFF}\approx 0$ V). The $R_{PUSH}$ impedance increases while the $R_{PULL}$ impedance stays high ohmic ($R_{PULL}=\square\Omega$).

At time $t_2$, the driver impedance $Z_{DRIVE}$ is adjusted to the target driver impedance $Z_{DRIVE}=120\Omega$. The push resistors 310 and 320 have reached the push impedance $R_{PUSH}=60\Omega$. As a result thereof, the differential driver voltage $V_{DIFF}$ is equal or smaller than maximum differential driver voltage $V_{max}(Z_{DRIVE}=120\Omega)$. Hence, the driver impedance $Z_{DRIVE}$ is now independent from the differential driver voltage $V_{DIFF}$ and will stay constant at the reached target driver impedance $Z_{DRIVE}=120\Omega$. The push impedance $R_{PUSH}$ is further controlled to increase to the target push impedance $R_{PUSH}$=120Ω, while at the same time the pull impedance $P_{PULL}$ is controlled to decrease to the target pull impedance $R_{PULL}$=120Ω. The driver impedance $Z_{DRIVE}$ is maintained constant at the target driver impedance $Z_{DRIVE}$=120Ω by the simultaneous adjustment of the push impedance $P_{PUSH}$ and pull impedance $P_{PULL}$.

At time $t_3$, the differential driver voltage $V_{DIFF}$ has reached the recessive differential voltage ($V_{DIFF}$≈0 V) of the recessive state. The $R_{PUSH}$ and $R_{PULL}$ impedance have reached the target impedance of 120Ω, which maintains the driver impedance $Z_{DRIVE}$ at the target driver impedance $Z_{DRIVE}$=120Ω. Between time $t_3$ and $t_4$ ringing due to reflection from a poor terminated network is be suppressed because of the driver impedance $Z_{DRIVE}$ at the output stage of the transmitter.

At time $t_4$ before the active recessive period $T_{ACTREC}$ lapses at time $t_5$ (i.e. $t_4$-$t_1$<$T_{ACTREC}$), the driver impedance $Z_{DRIVE}$ is adjusted from the target driver impedance $Z_{DRIVE}$ of the active recessive state to a target driver impedance $Z_{DRIVE}$ of the (passive) recessive state, which starts at time is (i.e. $t_5$-$t_1$=$T_{ACTREC}$).

For instance, between time to and is the driver impedance $Z_{DRIVE}$ is adjusted from the target driver impedance $Z_{DRIVE}$=120Ω of the active recessive state to high ohmic in the (passive) recessive state ($Z_{DRIVE}$=∞Ω), which extends until end of the bit time $T_{Bit}$ at time $t_6$ ($t_6$-$t_1$=$T_{Bit}$). The push impedances $R_{PUSH}$ as well as the pull impedances $R_{PULL}$ are controlled to simultaneously increase from the target impedances $R_{PUSH}$, $R_{PULL}$=120Ω to high ohmic ($R_{PUSH}$, $R_{PULL}$=∞Ω) in order to keep the differential driver voltage $V_{DIFF}$ at the recessive differential voltage ($V_{DIFF}$≈0 V).

Between time $t_5$ and $t_6$, the driver impedance $Z_{DRIVE}$ stays high ohmic such that a transition from recessive state to dominant state may occur at time $t_6$, where the bit time $T_{Bit}$ lapses ($t_6$-$t_1$=$T_{Bit}$).

In the above case, the driver impedance $Z_{DRIVE}$ has been adjusted to 120Ω in the active recessive state in order to suppress potential reflections in that a well terminated network is ensured by the driver impedance $Z_{DRIVE}$=120Ω of the actively driving transmitter. In another example, the driver impedance $Z_{DRIVE}$ has been adjusted to a low ohmic impedance (e.g. $R_{DOM}$=15Ω) in the active recessive state in order to dissipate the energy of potential reflections on the network. It should be noted it depends on the real case network topology whether a target driver impedance $Z_{DRIVE}$ substantially at the termination resistance (described above with reference to FIG. 6) or a low ohmic target driver impedance $Z_{DRIVE}$ (described in the following) during the active recessive state is more effective to eliminate potential reflections on the network. The skilled person using the present concept has to consider a trade-off between dissipating more of the reflected energy with a low ohmic impedance versus creating new reflections due to not driving at the cable impedance, typical used cables have a cable impedance in the range of 100 to 120Ω.

Referring now to FIG. 7, a signaling diagram showing an example operation of a bus transceiver circuit according to another example of the present invention is schematically illustrated. In this example, the time taken to transmit a bit is bit time $T_{Bit}$=500 ns. It will be appreciated that the time $T_{Bit}$ taken to transmit a bit corresponds to the data rate of the CAN bus. In this case the bit time $t_{Bit}$=500 ns corresponding to a data bit rate of 2 MBits/s, however the data rate may change with the operation of the CAN bus. It will be appreciated that when the data rate changes, for example due to a change in operation mode, the bit time $T_{Bit}$=500 ns and all further related time periods will change accordingly. For the sake of explanation only it should further be assumed that the lowest driver impedance value $R_{DOM}$=15Ω, the voltage drop of the diodes $\Delta V_{Diode}$=1 V, $V_{CC}$=5 V is supplied to the voltage supply rail, the termination resistance is $R_{Term}$=120Ω, and the equivalent bus impedance is $R_{BUS}$=60Ω.

In the dominant state, the push resistors 310 and 320 are controlled to stay at push impedance $R_{PUSH}$=$R_{DOM}$=15Ω and the pull resistors 315 and 325 are controlled to stay high ohmic, which results in a low ohmic driver impedance $Z_{DRIVE}$=30Ω.

In response to the detection of the dominant to recessive transition at time $t_1$, the driver impedance $Z_{DRIVE}$ is adjusted from the starting driver impedance $Z_{DRIVE}$=30Ω, representing the low ohmic driver impedance during $Z_{DRIVE}$ during dominant state, to a target driver impedance $Z_{DRIVE}$=15Ω; the adjustment is preferably performed continuously over time and more preferably at a constant change rate. The driver impedance $Z_{DRIVE}$ is adjusted by controlling the pull resistors 315 and 325 to decrease their impedances from the starting high ohmic pull impedance ($R_{PULL}$=∞Ω) to the target pull impedance $R_{PULL}$=15 Ω of the active recessive state; the adjustment is preferably performed continuously over time and more preferably at a constant change rate. The push resistors 310 and 320 are controlled to stay at the push impedance $R_{PUSH}$=15Ω, which is the target push impedance $R_{PUSH}$ of the active recessive state.

At time $t_1$, a transition from dominant to recessive in the TXD signals is detected by the edge detector. The driver impedance $Z_{DRIVE}$ is adjusted from the driver impedance $Z_{DRIVE}$=30 Ω to a target driver impedance $Z_{DRIVE}$=15 Ω and the differential driver voltage $V_{DIFF}$ on the CAN bus is adjusted from the dominant differential voltage ($V_{DIFF}$≈2 V) to the recessive differential voltage ($V_{DIFF}$≈0 V). The push impedance $R_{PUSH}$ stays the same while the pull impedance $R_{PULL}$ is controlled to increase to the target pull impedance $R_{PULL}$=15Ω.

At time $t_2$, the pull impedance $R_{PULL}$ has reached the target pull impedance $R_{PULL}$=15Ω. The push impedance $R_{PUSH}$ and pull impedance $R_{PULL}$ are both at the target impedance=15 Ω resulting therein that the driver impedance $Z_{DRIVE}$ has also reached the target driver impedance $Z_{DRIVE}$=15 Ω of the active recessive state. The differential driver voltage $V_{DIFF}$ has reached the recessive state (recessive differential voltage $V_{DIFF}$≈0 V). During active recessive state, the ringing due to reflection from a poor terminated network is dissipated.

At time $t_3$ before the active recessive period $T_{ACTREC}$ lapses at time $t_5$ (i.e. $t_3$-$t_1$<$T_{ACTREC}$), the driver impedance $Z_{DRIVE}$ is adjusted from the target driver impedance $Z_{DRIVE}$ of the active recessive state to a target driver impedance $Z_{DRIVE}$ of the (passive) recessive state, which is reached at time to (i.e. $t_5$-$t_1$=$T_{ACTREC}$).

For instance, between time $t_3$ and $t_4$ the driver impedance $Z_{DRIVE}$ is adjusted from the target driver impedance $Z_{DRIVE}$=15 Ω of the active recessive state to high ohmic ($Z_{DRIVE}$=∞Ω) in the (passive) recessive state, which extends until end of the bit time $T_{Bit}$ at time $t_5$ ($t_5$-$t_1$=$T_{Bit}$). The push impedances $R_{PUSH}$ as well as the pull impedances $R_{PULL}$ are controlled to simultaneously increase from the target impedances $R_{PUSH}$, $R_{PULL}$=15 Ω to high ohmic impedance ($R_{PUSH}$, $R_{PULL}$=∞Ω) in order to keep the differential driver voltage $V_{DIFF}$ at the recessive differential voltage ($V_{DIFF}$≈0 V).

Between time $t_4$ and $t_5$, the driver impedance $Z_{DRIVE}$ stays high ohmic such that a transition from recessive state to dominant state may occur at time $t_5$, where the bit time $T_{Bit}$ lapses.

The transmitter circuit suggested in the present application may be further applied to drive a negative differential driver voltage $V_{DIFF}$ on the bus during an active recessive state. By driving a negative differential driver voltage $V_{DIFF}$, a ringing may be suppressed and more voltage margin may be created with respect to a receiver voltage threshold.

Figure 8B:
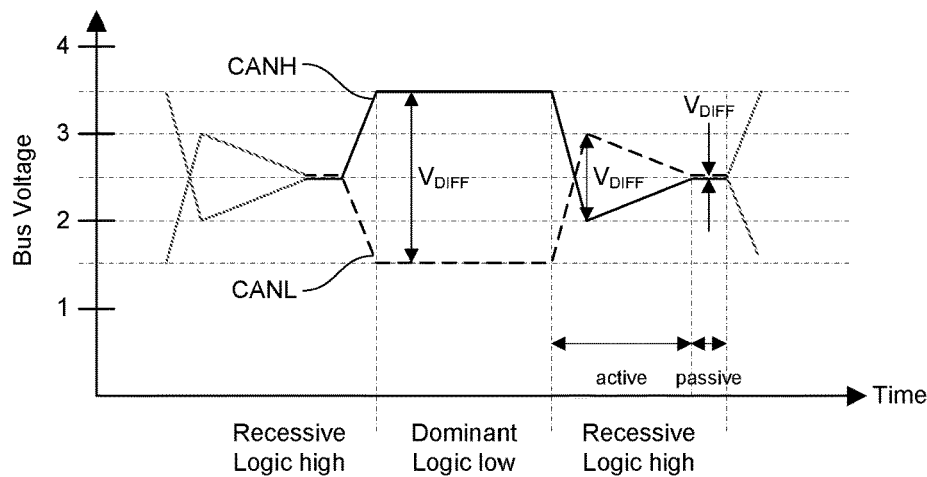

As illustrated in FIG. 8b, the differential driver voltage $V_{DIFF}$ on the bus may vary between a maximum value (dominant) and minimum value (active recessive). It will be appreciated that these values may have opposite polarity with the reference value (passive recessive) between them. When the differential driver voltage $V_{DIFF}$ is positive (dominant), a dominant state is asserted on the bus. When the differential driver voltage $V_{DIFF}$ is at the reference differential voltage ($V_{DIFF} \approx 0$ V), a recessive state is asserted and the bus is in passive recessive state. When the differential driver voltage $V_{DIFF}$ is negative (active recessive), a recessive state is asserted and the bus is in active recessive state.

Figure 8A:
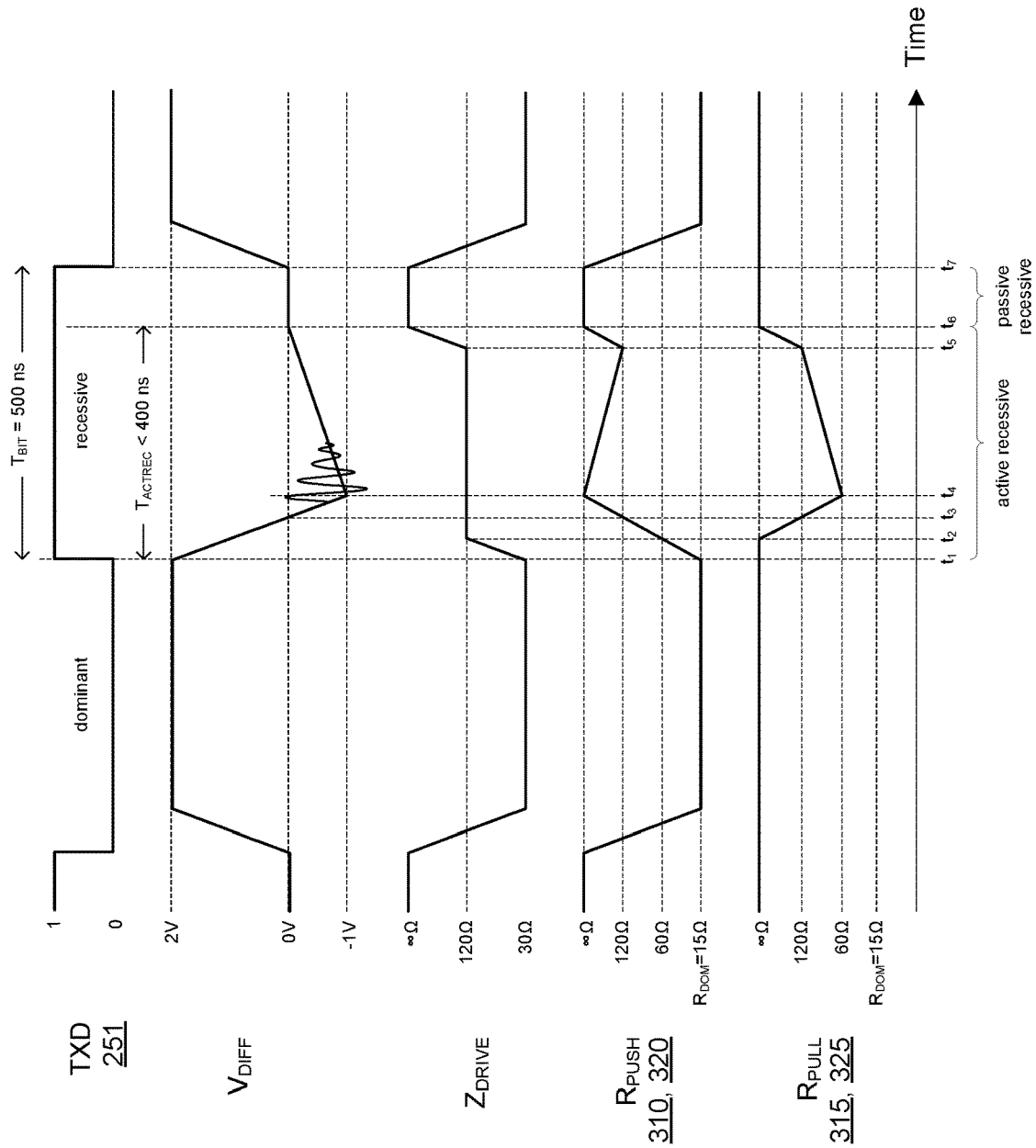
FIG. 8a schematically illustrates a signaling diagram showing an example operation of a bus transceiver circuit according to a further example of the present invention.

Referring now to FIG. 8a, a signaling diagram showing an example operation of a bus transceiver circuit according to a further example of the present invention is schematically illustrated. In this example, the time taken to transmit a bit is bit time $T_{Bit}$=500 ns. It will be appreciated that the time $T_{Bit}$ taken to transmit a bit corresponds to the data rate of the CAN bus. In this case the bit time $t_{Bit}$=500 ns corresponding to a data bit rate of 2 MBits/s, however the data rate may change with the operation of the CAN bus. It will be appreciated that when the data rate changes, for example due to a change in operation mode, the bit time $T_{Bit}$=500 ns and all further related time periods will change accordingly. For the sake of explanation only it should further be assumed that the lowest driver impedance value $R_{DOM}$=15Ω, the voltage drop of the diodes $\Delta V_{Diode}$=1 V, $V_{CC}$=5 V is supplied to the voltage supply rail, the termination resistance is $R_{Term}$=120Ω, and the equivalent bus impedance is $R_{BUS}$=60Ω.

In operation, the CAN bus controller 220 provides a serial bit stream 400 to the CAN transceiver 210 for transmission on the bus. The edge detector 330 monitors edges on this bit stream. At time $t_1$, the signal on TXD 251 transitions from low to high, which will cause a dominant to recessive transition of the differential driver voltage $V_{DIFF}$ on the CAN bus 110.

In the dominant state, the push resistors 310 and 320 are controlled to stay at $R_{PUSH}$=$R_{DOM}$=15Ω and the pull resistors 315 and 325 are controlled to stay high ohmic, which results in a low ohmic driver impedance $Z_{DRIVE}$=30Ω.

In response to the detection of the dominant to recessive transition a time $t_1$, the push resistors 310 and 320 are controlled to increase their impedances from the starting push impedance $R_{PUSH}$=15Ω to high ohmic as target push impedance ($R_{PUSH}$=∞Ω), the adjustment is preferably performed continuously over time and more preferably at a constant change rate. At the same time, the pull impedance $R_{PULL}$ of the pull resistors 315 and 325 stay high ohmic ($R_{PULL}$=∞Ω). In response thereto, the driver impedance $Z_{DRIVE}$ changes from driver impedance $Z_{DRIVE}$=30Ω to a target driver impedance $Z_{DRIVE}$=120Ω and the differential driver voltage $V_{DIFF}$ drops from dominant differential voltage ($V_{DIFF}$≈2 V) to the passive recessive differential voltage or reference differential voltage ($V_{DIFF}$≈0V).

At time $t_2$, the push resistors 310 and 320 have reached a push impedance $R_{PUSH}$=60Ω and the driver impedance $Z_{DRIVE}$ has reached the target driver impedance $Z_{DRIVE}$=120Ω. From time $t_2$ onwards, the differential driver voltage $V_{DIFF}$ is equal to or smaller than maximum differential driver voltage $V_{max}(Z_{DRIVE}$=120Ω). Hence, the driver impedance $Z_{DRIVE}$ is now independent from the differential driver voltage $V_{DIFF}$ and will stay constant at the reached target driver impedance $Z_{DRIVE}$=120Ω. The pull resistors 315 and 325 are controlled to decrease their impedances from high ohmic ($R_{PULL}$=∞Ω) to a target pull impedance $R_{PULL}$=60Ω, the adjustment is preferably performed continuously over time and more preferably at a constant change rate. The driver impedance $Z_{DRIVE}$ stays at the target driver impedance $Z_{DRIVE}$=120Ω in response to a further increase of the push impedance $R_{PUSH}$ and decrease of the pull impedance $R_{PULL}$.

At time $t_3$, the differential driver voltage $V_{DIFF}$ has reached the passive recessive differential voltage or reference differential voltage ($V_{DIFF}$≈0 V). The push impedance $R_{PUSH}$ and the pull impedance $R_{PULL}$ have reached a pull/push impedance $R_{PUSH}/R_{PULL}$=120Ω, such that the driver impedance $Z_{DRIVE}$ is maintained at the target driver impedance $Z_{DRIVE}$=120Ω. The differential driver voltage $V_{DIFF}$ further drops.

At time $t_4$, the differential driver voltage $V_{DIFF}$ has reached an active recessive differential voltage ($V_{DIFF}$≈−1 V). The push impedance $R_{PUSH}$ has reached the high ohmic target push impedance ($R_{PUSH}$=∞Ω) and the pull impedance $R_{PULL}$ has reached the target pull impedance $R_{PULL}$=60Ω resulting in the driver impedance $Z_{DRIVE}$ is maintained at the target driver impedance $Z_{DRIVE}$=120Ω.

Between $t_4$ and $t_5$, the push resistors 310 and 320 are controlled to decrease their impedances from the target high ohmic impedance ($R_{PUSH}$=∞Ω) to a push impedance $R_{PUSH}$=120Ω and the pull resistors 315 and 325 are controlled to increase their impedances from the target push impedance $R_{PUSH}$=60Ω to a pull impedance $R_{PULL}$=120Ω. The adjustment is preferably performed continuously over time and more preferably at a constant change rate. In response thereto, the differential driver voltage $V_{DIFF}$ is increasing from the active recessive differential voltage ($V_{DIFF}$≈−1 V) to the passive recessive differential voltage ($V_{DIFF}$≈0 V), while the driver impedance $Z_{DRIVE}$ is further maintained at the target driver impedance $Z_{DRIVE}$=120Ω. Ringing is more effective suppressed since the driver impedance $Z_{DRIVE}$ does not become high ohmic during this transition to the passive recessive differential voltage ($V_{DIFF}$≈0 V). The active recessive state extends over a period $T_{ACTREC}$ from time $t_1$ to time $t_5$ ($t_5-t_1$=$T_{ACTREC}$).

Between time $t_5$ and $t_6$, the push resistors 310 and 320 are controlled to increase their impedances from the push/pull impedance $R_{PUSH}/R_{PULL}$=120Ω to high ohmic ($R_{PUSH}/R_{PULL}$∞Ω), the adjustment is preferably performed continuously over time and more preferably at a constant change rate. In response thereto, differential driver voltage $V_{DIFF}$ is maintained at the passive recessive differential voltage ($V_{DIFF}$≈0 V) and the driver impedance $Z_{DRIVE}$ increases from the target driver impedance $Z_{DRIVE}$ to high ohmic ($Z_{DRIVE}$=∞Ω).

At time $t_6$, the push impedance $R_{PUSH}$ and pull impedance $R_{PULL}$ are high ohmic ($R_{PUSH}/R_{PULL}$=∞Ω) resulting in the driver impedance $Z_{DRIVE}$ being high ohmic ($Z_{DRIVE}$=∞Ω), which is the target driver impedance of the passive recessive state, which starts at time $t_6$. The differential driver voltage $V_{DIFF}$ is further maintained at the passive recessive differential voltage ($V_{DIFF}$≈0 V).

Between time $t_6$ and $t_7$, the driver impedance $Z_{DRIVE}$ stays high ohmic such that a transition from recessive state to dominant state may occur at time $t_7$, where the bit time $T_{Bit}$ lapses ($t_7-t_1=T_{Bit}$).

A large number of nodes connected to the CAN bus network such as that exemplified with reference to FIGS. 1 and 3 increases the capacitive bus loading. A high capacitive bus loading may limit the maximum attainable data transmission rate due to the passive discharging of the bus capacitance during transition from dominant state to recessive state. The limitation due to passive discharging of the bus capacitance is in particular observed at data transmission rates of 5 Mbit/s and above.

The CAN standard (such as ISO 11898-2:2016) has no requirement on the length of the dominant to recessive edge. However in some applications, the maximum delay from detection of a dominant to recessive transmission in the data stream on TXD to a drop of the differential driver voltage $V_{DIFF}=0.5$ V may not exceed a predefined maximum delay such as e.g. a maximum delay of 140 ns. In order to ascertain the compliance with such a predefined maximum delay, which will be referred to also as predefined delay $T_{TXD-BUS}$, may be applied as a maximum duration required for the transmitter to drive high-ohmic the bus starting from the detection of the transition from dominant to recessive.

Figure 9:
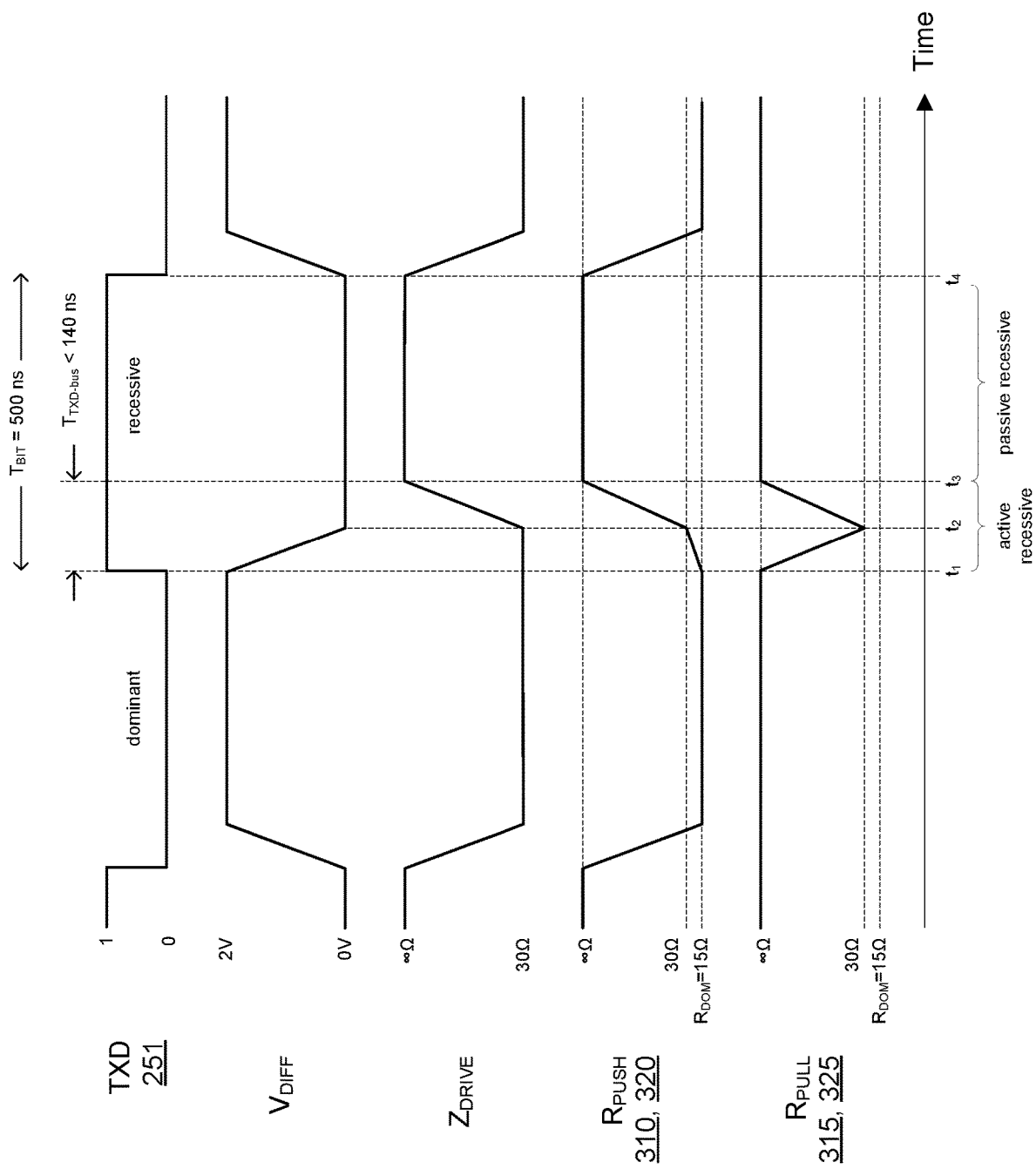
FIG. 9 schematically illustrates a signaling diagram showing an example operation of a bus transceiver circuit according to yet another example of the present invention.

Referring now to FIG. 9, a signaling diagram showing an example operation of a bus transceiver circuit according to yet another example of the present invention is schematically illustrated. In this example, the time taken to transmit a bit is bit time $T_{Bit}=500$ ns. It will be appreciated that the time $T_{Bit}$ taken to transmit a bit corresponds to the data rate of the CAN bus. In this case the bit time $t_{Bit}=500$ ns corresponding to a data bit rate of 2 MBits/s, however the data rate may change with the operation of the CAN bus. It will be appreciated that when the data rate changes, for example due to a change in operation mode, the bit time $T_{Bit}=500$ ns and all further related time periods will change accordingly. For the sake of explanation only it should further be assumed that the lowest driver impedance value $R_{DOM}=15\Omega$, the voltage drop of the diodes $\Delta V_{Diode}=1$ V, $V_{CC}=5$ V is supplied to the voltage supply rail, the termination resistance is $R_{Term}=120\Omega$, and the equivalent bus impedance is $R_{BUS}=60\Omega$.

In operation, the CAN bus controller 220 provides a serial bit stream 400 to the CAN transceiver 210 for transmission on the bus. The edge detector 330 monitors edges on this bit stream. At time $t_1$, the signal on TXD 251 transitions from low to high, which will cause a dominant to recessive transition of the differential driver voltage $V_{DIFF}$ on the CAN bus 110.

In the dominant state, the push resistors 310 and 320 are controlled to stay at $R_{PUSH}=R_{DOM}=15\Omega$ and the pull resistors 315 and 325 are controlled to stay high ohmic, which results in a low ohmic driver impedance $Z_{DRIVE}=30\Omega$.

In response to the detection of the dominant to recessive transition at time $t_1$, the push resistors 310 and 320 are controlled to increase their impedances from the starting push impedance $R_{PUSH}=15\Omega$ to a target push impedance $R_{PUSH}=30\Omega$, the adjustment is preferably performed continuously over time and more preferably at a constant change rate. At the same time, the pull resistors 315 and 325 are controlled to decrease their impedances from the starting high ohmic ($R_{PULL}=\infty\Omega$) to a target pull impedance $R_{PULL}=30\Omega$, the adjustment is preferably performed continuously over time and more preferably at a constant change rate. The impedances of the push resistors 310 and 320 and the pull resistors 315 and 325 are simultaneous adjusted such that the driver impedance $Z_{DRIVE}$ stays at the driver impedance $Z_{DRIVE}=30\Omega$, which is the driver impedance $Z_{DRIVE}$ in dominant state.

The differential driver voltage $V_{DIFF}$ drops for dominant differential voltage ($V_{DIFF}\approx 2$ V) to the recessive differential voltage ($V_{DIFF}\approx 0$ V) during impedance adjustment of the push resistors 310 and 320 and the pull resistors 315 and 325.

At time $t_2$, the impedances of the pull resistors 315 and 325 have reached the target push impedance $R_{PUSH}=30\Omega$ and the differential driver voltage $V_{DIFF}$ is dropped to the recessive differential voltage ($V_{DIFF}\approx 0$ V).

Starting from the time $t_2$ to a time $t_3$, which corresponds to the end of the predefined delay $T_{TXD-BUS}$ ($T_3-t_1=T_{TXD-BUS}$), the impedances of the push resistors 310 and 320 and the pull resistors 315 and 325 are controlled to increase from the current push/pull impedance $R_{PUSH}$, $R_{PULL}=30\Omega$ to high ohmic driver impedance $Z_{DRIVE}$ of the (passive) recessive state, which starts at time $t_3$. The adjustment is preferably performed continuously over time and more preferably at a constant change rate.

The driver impedance $Z_{DRIVE}$ increased starting from the driver impedance $Z_{DRIVE}=30\Omega$ to high ohmic driver impedance $Z_{DRIVE}$ of the (passive) recessive state ($Z_{DRIVE}=\infty\Omega$) in response to the impedance adjustment of the push resistors 310, 320 and the pull resistors 315 and 325.

Maintaining the driver impedance $Z_{DRIVE}$ low ohmic and driving the bus low ohmic during a sub-period $t_2-t_1$ of the predefined maximum delay $T_{TXD-BUS}$ enables a fast discharge of the loaded charge on a high capacitive bus. Accordingly, a drop of the differential driver voltage $V_{DIFF}$ to a predefined threshold value in response to the detection of a dominant to recessive transition can be ascertained.

In the foregoing, it has been explained that ringing, which may corrupt data communication, may occur in network with unterminated stub lines and/or impedance mismatch due to sub lines. In particular, this is an issue when increasing data transmission rates such as CAN FD protocol. Suppressing signal ringing is a necessary requirement to enable the increase of the data transmission rates. Redesign of the network topology to improve the termination and reduce ringing to support higher data-rate CAN FD communication is a costly and time-consuming measure and may result in longer bus cables with potential impact on other constraints of the network such as bus arbitration. The transmitter circuit of the present application enables communication with high data transmission rates on existing network topology without topology changes and is also robust against disturbance on the bus (glitches/EMC).

According to an embodiment of the present application, a circuit is provided, which comprises two bus line terminals for coupling to a bus, a transmit data input and a bride circuit with adjustable resistances. The adjustable resistances of the bridge circuit enable to independently adjust a driver impedance and to independently adjust a differential driver voltage on the bus.

According to an example, the bridge circuit has two legs, each of which further comprises an adjustable pull resistance and an adjustable push resistance connected in series with a respective one of the two bus line terminals. According to an example, the circuit further comprises an edge detector, which is coupled to a transmit data input and configured to detect a transition on the transmit data input and to adjust the impedances of the adjustable pull resistances and the adjustable push resistances in response to the detected transition.

According to an example, one of the legs comprises the adjustable push resistance connected in series with one of the bus line terminals and further in series with one of the adjustable pull resistance. The other one of the legs comprises the adjustable pull resistance connected in series with one of the bus line terminals and further in series with one of the adjustable push resistance.

According to an example, the circuit further comprises a voltage supply rail; and a ground rail. The bridge circuit is connected between the voltage supply rail and the ground rail.

According to an example, the adjustable push resistance of one of the legs and the adjustable pull resistance of the other one of the legs are connected to the voltage supply rail. The adjustable pull resistance of the one leg and the adjustable push resistance of the other one leg are connected to the ground rail.

According to an example, the edge detector is configured to adjust the adjustable pull resistances to a same push impedance $R_{PULL}$ at each point in time and to adjust the adjustable push resistances to a same impedance $R_{PUSH}$ at each point in time.

According to an example, the circuit further comprises a set of diodes, each of which connected in series to one of the adjustable pull resistances and the adjustable push resistances.

According to an example, the adjustable pull resistances and the adjustable push resistances have adjustable impedance characteristics dependent on a set of parameters.

According to an example, the adjustable pull resistances and the adjustable push resistances are adjustable within a impedance range between a lower resistance $R_{DOM}$ and an upper high ohmic impedance.

According to an example, the set of parameters comprises two parameters x and y. The impedance characteristic $R_{PUSH}$ of the adjustable push resistances is $$R_{PUSH} = \frac{R_{DOM}}{x \cdot y}$$

The impedance characteristic $R_{PULL}$ of the adjustable push resistances is $$R_{PULL} = \frac{R_{DOM}}{(1-x) \cdot y}$$

The parameters x and y may vary in the value range of x=(0, 1) and y=(0, 2), respectively. In particular, the parameter x may vary in the value range x=(0, 1)={x∈$\mathcal{R}$, 0<X<1} and the parameter y may vary in the value range y=(0, 2]={y∈$\mathcal{R}$, 0<y≤2}.

According to an example, the edge detector is configured to detect one of a transition from dominant to recessive and a transition from recessive to dominant.

According to an example, the edge detector is configured to adjust the adjustable pull resistances and the adjustable push resistances to target impedances such that the circuit drives the bus with a target driver impedance for a predefined subperiod $T_{ACTREC}$ of a bit time $T_{Bit}$.

According to an example, the edge detector is further configured to adjust the adjustable pull resistances and the adjustable push resistances such that the circuit drives the bus high ohmic for a remaining subperiod of the bit time $T_{Bit}$.

According to an example, the target driver impedance $Z_{DRIVE}$ comprises one of substantially a termination resistance $R_{Term}$ and a low ohmic impedance less that the termination resistance $R_{Term}$.

According to an example, a drive impedance $Z_{DRIVE}$ of the circuit is adjustable to $$Z_{DRIVE} = 2 \cdot \frac{R_{DOM}}{y}$$

where $Z_{Drive}$ is the drive impedance of the circuit (300) and $R_{DOM}$ is a predefined resistance.

A differential driver voltage $V_{DIFF}$ is adjustable to $$V_{DIFF} = \frac{R_{BUS}}{R_{BUS} + Z_{DRIVE}} \cdot (2x-1) \cdot V_{CC\_eff}$$

where $V_{CC\_eff}$ is an effective supply voltage available to the circuit (e.g. supply voltage $V_{CC}$ minus voltage drops due to further components in the circuit) and $R_{BUS}$ is an impedance of the bus.

According to an example, the drive impedance $Z_{DRIVE}$ of the circuit is adjustable in a range [$R_{DOM}$, high ohmic] for y=2 and y→0, respectively.

According to an example, the differential driver voltage $V_{DIFF}$ is adjustable in a range [$V_{min}$, $V_{max}$] for x→0 and x→1, respectively, wherein $$V_{min} = V_{DIFF}(x=0) = -\frac{R_{BUS}}{R_{BUS} + Z_{DRIVE}} \cdot V_{CC_{effective}} = -V_{limit}$$

and $$V_{max} = V_{DIFF}(x=1) = \frac{R_{BUS}}{R_{BUS} + Z_{DRIVE}} \cdot V_{CC\_eff} = V_{limit}$$

According to an example, the effective supply voltage $V_{CC\_eff}$ is substantially equal to voltage $V_{CC}$ between supply voltage rail and ground rail minus voltage drops of further components connected in the legs such as the diodes. For example, $$V_{CC\_eff} = V_{CC} - 2 \cdot \Delta V_{Diode}$$

in case of diodes connected in series with each push resistance and pull resistance of the legs, wherein $\Delta V_{Diode}$ is the voltage drop at each of the diodes.

According to an embodiment of the present application, a transceiver is provided, which comprises a transmitter arranged to receive a transmit data input and to provide a drive signal to a bus. The transmitter comprises a circuit according an aforementioned example.

According to an example, the bus is a two-line bus using differential signaling for transmitting data. In particular, the bus is a CAN bus.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

By way of illustration and not of limitation, the accompanying figures show specific aspects in which the subject matter may be practiced. It is noted that arrows at one or both ends of connecting lines are intended to show the general direction of electrical current flow, data flow, logic flow, etc. Connector line arrows are not intended to limit such flows to a particular direction such as to preclude any flow in an opposite direction. The aspects illustrated are described in sufficient detail to enable those skilled in the art to practice the teachings disclosed herein. Other aspects may be used and derived therefrom, such that structural and logical substitutions and changes may be made without departing from the scope of this disclosure. This Detailed Description, therefore, is not to be taken in a limiting sense. The breadth of various aspects is defined by the appended claims and the full range of equivalents to which such claims are entitled.

Those of skill would further appreciate that the various illustrative logical blocks, modules, circuits, and algorithm steps described in connection with the disclosure herein may be implemented as electronic hardware, computer software, or combinations of both. To illustrate clearly this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

The invention claimed is:

1. A circuit, comprising:
    two bus line terminals for coupling data, in response to a transmit data input, to a bus;
    a bridge circuit being configured with two legs each including an adjustable pull resistance and an adjustable push resistance connected in series with a respective one of the two bus line terminals and with adjustable resistances, and being operable in a plurality of states including a dominant state and a recessive state, the recessive state to permit an external circuit to drive the bus while the bridge circuit is connected to the bus via a connection that manifests a high impedance load on the bus; and
    an edge detector configured to detect a transition on the transmit data input and to adjust the impedances of the adjustable pull resistances and the adjustable push resistances in response to the detected transition through which the impedance of the bus is adjusted and for operation of the bridge circuit to drive the bus using the dominant state; wherein the adjustable resistances of the bridge circuit: are to independently adjust a driver impedance and to independently adjust a differential driver voltage on the bus to set an impedance of the bus for an impedance load on the bus that is lower than the high impedance load for an operation of the bridge circuit during which the bridge circuit is to drive the bus; and have adjustable impedance characteristics dependent on parameters x and y, wherein the impedance characteristic of the adjustable push resistances is $R_{PUSH}=R_{DOM}/(x\ y)$, wherein $R_{DOM}$ is a predefined impedance, and the impedance characteristic ($R_{PULL}$) of the adjustable pull resistances is $R_{PULL}=R_{DOM}/(1-x)y$, and $x=(0, 1)$ and $y=(0, 2)$.

2. The circuit according to claim 1, wherein the bridge circuit has first and second legs, each leg connected to a voltage supply rail and to a reference voltage node, in which:
the first leg includes an adjustable push resistance connected in series with a first one of the bus line terminals and the voltage supply rail, and an adjustable pull resistance connected in series with the first bus line terminal and the reference voltage node, and
the second leg includes an adjustable pull resistance connected in series with a second one of the bus line terminals and the voltage supply rail, and an adjustable push resistance connected in series with the second bus line terminal and the reference voltage node.

3. The circuit according to claim 1, further comprising:
a voltage supply rail; and
a ground rail,
wherein the bridge circuit is connected between the voltage supply rail and the ground rail.

4. The circuit according to claim 1, further comprising a voltage supply rail and a ground rail, wherein:
the bridge circuit is connected between the voltage supply rail and the ground rail;
the adjustable push resistance of one of the legs and the adjustable pull resistance of the other one of the legs are connected to the voltage supply rail; and
the adjustable pull resistance of the one leg and the adjustable push resistance of the other one leg are connected to the ground rail.

5. The circuit according to claim 1, wherein the edge detector is configured to adjust the adjustable pull resistances to a same push impedance at each point in time and to adjust the adjustable push resistances to a same impedance at each point in time.

6. The circuit according to claim 1, further comprising:
a set of diodes, each of which connected in series to one of the adjustable pull resistances and the adjustable push resistances.

7. The circuit according to claim 1,
wherein the adjustable resistances are adjustable between a first impedance and a second impedance that is higher than the first impedance.

8. The circuit according to claim 1,
wherein the edge detector is configured to detect one of a transition from dominant to recessive and a transition from recessive to dominant.

9. The circuit according to claim 1,
wherein the edge detector is configured to adjust the adjustable pull resistances and the adjustable push resistances to target impedances such that the circuit drives the bus with a target driver impedance for a predefined subperiod of a bit time.

10. The circuit according to claim 9,
wherein the edge detector is further configured to adjust the adjustable pull resistances and the adjustable push resistances such that the circuit drives the bus high ohmic for a remaining subperiod of the bit time.

11. The circuit according to claim 9,
wherein the target driver impedance comprises one of a termination resistance and a low ohmic impedance less than the termination resistance.

12. The circuit according to claim 1,
wherein a drive impedance ($Z_{DRIVE}$) of the circuit is adjustable to $2(R_{DOM})/y$, wherein $R_{DOM}$ is a predefined impedance, and a differential driver voltage ($V_{DIFF}$) for the circuit is adjustable according to $V_{DIFF}=R_{BUS}/(R_{BUS}+Z_{DRIVE})$ $(2X-1)$ $V_{CC\_effective}$, and
wherein $V_{CC\_effective}$ is an effective supply voltage available to the circuit and $R_{BUS}$ is an impedance of the bus.

13. A transceiver, comprising:
a transmitter arranged to receive a transmit data input and to provide a drive signal to a bus, wherein the transmitter comprises a circuit according to claim 1.

14. The circuit according to claim 1, wherein the bridge circuit is configured and arranged to mitigate ringing on the bus by adjusting the driver impedance and the differential driver voltage independently from one another.

15. An apparatus comprising:
a first terminal configured to couple to a high level line of a bus having a nominal impedance across the bus line terminals as characterized by termination resistances at respective ends of the bus;
a second terminal configured to couple to a low level line of the bus; and
a bridge circuit coupled to the first and second terminals and configured with a plurality of adjustable resistor circuits including two legs and each having an adjustable pull resistor circuit and an adjustable push resistor circuit connected in series with one of the first and second terminals coupled to the bridge circuit, the adjustable resistor circuits:
being configured to adjust a driver impedance and a differential driver voltage across the high and low level bus lines independently from one another, and
having adjustable impedance characteristics dependent on parameters x and y, wherein the impedance characteristic of the adjustable push resistances is $R_{PUSH}=R_{DOM}/(x\ y)$, wherein $R_{DOM}$ is a predefined impedance, and the impedance characteristic ($R_{PULL}$) of the adjustable pull resistances is $R_{PULL}=R_{DOM}/(1-x)y$, and $x=(0, 1)$ and $y=(0, 2)$, wherein the bridge circuit is operable in a plurality of states including a recessive state to permit an external circuit to drive the bus while the bridge circuit is connected to the bus via a connection that manifests a high impedance load on the bus to maintain the nominal impedance, and including a dominant state to permit the bridge circuit to drive the bus while the bridge circuit is connected to the bus via a connection that manifests an impedance load on the bus which is lower than the high impedance load.

16. The apparatus of claim 15, wherein the driver impedance and the differential driver voltage are adjustable by the bridge circuit to set the impedance of the bus during at least one state of the plurality of states other than the recessive state.

17. The apparatus of claim 15, wherein the bridge circuit is configured and arranged to mitigate ringing on the bus by adjusting the driver impedance and the differential driver voltage independently from one another.

18. The circuit according to claim 1, wherein the bridge circuit is to provide the adjustable resistances connected to the two bus line terminals while maintaining a nominal impedance, across the bus line terminals, as characterized by termination resistances at respective ends of the bus.

19. The circuit according to claim 1, wherein the bus has a nominal impedance across the bus line terminals as characterized by termination resistances at respective ends of the bus, and wherein the bridge circuit is to maintain the nominal impedance across the bus line terminals during at least one of the plurality of states.

20. The circuit according to claim 1, wherein the bus is terminated with respective termination resistances at the ends of the bus to provide a nominal cable impedance, approximately equal ½ of the sum of the respective termination resistances, while the bridge circuit is connected to the two bus line terminals.

21. The apparatus according to claim 15, further including a plurality of circuit nodes, a first of the plurality of circuit nodes including the aforesaid bridge circuit and a second of the plurality of circuit nodes including another bridge circuit that is coupled to the bus via the first and second terminals, that includes a plurality of adjustable resistor circuits to adjust a driver impedance and a differential driver voltage across the high and low level bus lines independently from one another, wherein said another bridge circuit is operable in a plurality of states including: a recessive state to permit the bridge circuit of the first of the plurality of circuit nodes to drive the bus while said another bridge circuit is connected to the bus via a connection that manifests a high impedance load on the bus, and including a dominant state to permit said another bridge circuit to drive the bus while said another bridge circuit is connected to the bus via a connection that manifests an impedance load on the bus which is lower than the high impedance load, and wherein the bus has a nominal impedance across the bus line terminals as characterized by termination resistances at respective ends of the bus, and wherein for each of the respective bridge circuit during at least one of its plurality of states, the respective bridge circuit and its adjustable resistor circuits are to maintain the nominal impedance across the bus line terminals.

\* \* \* \* \*